United States Patent
Ahmed et al.

(10) Patent No.: US 6,812,119 B1
(45) Date of Patent: Nov. 2, 2004

(54) NARROW FINS BY OXIDATION IN DOUBLE-GATE FINFET

(75) Inventors: Shibly S. Ahmed, San Jose, CA (US); Ming-Ren Lin, Cupertino, CA (US); Haihong Wang, Milpitas, CA (US); Bin Yu, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/614,052

(22) Filed: Jul. 8, 2003

(51) Int. Cl.$^7$ ................. H01L 21/3205; H01L 21/4763
(52) U.S. Cl. ...................................... 438/585; 438/596
(58) Field of Search .............................. 438/585, 286, 438/283, 696, 157, 164, 151, 396, 304, 596

(56) References Cited

U.S. PATENT DOCUMENTS

| | | | |
|---|---|---|---|
| 6,583,469 B1 * | 6/2003 | Fried et al. ................. | 438/151 |
| 6,630,388 B2 * | 10/2003 | Sekigawa et al. ........... | 438/396 |
| 6,642,090 B1 * | 11/2003 | Fried et al. ................. | 438/164 |
| 6,645,797 B1 * | 11/2003 | Buynoski et al. ........... | 438/157 |
| 6,657,252 B2 * | 12/2003 | Fried et al. ................. | 257/316 |
| 6,657,259 B2 * | 12/2003 | Fried et al. ................. | 257/350 |
| 6,706,571 B1 * | 3/2004 | Yu et al. ..................... | 438/157 |
| 6,709,982 B1 * | 3/2004 | Buynoski et al. ........... | 438/696 |
| 2003/0042531 A1 | 3/2003 | Lee et al. | |
| 2004/0048424 A1 | 3/2004 | Wu et al. | |

OTHER PUBLICATIONS

Copy of U.S. Ser. No. 10/699,887; filed Nov. 4, 2003; entitled: "Self Aligned Damascene Gate," 35 pages.
Co–pending U.S. application Ser. No. 10/348,910 filed Jan. 23, 2003 entitled: "Narrow Fin FinFet," 16 page specification, 13 sheets of drawings.

Digh Hisamoto et al., "FinFET–A Self–Aligned Double–Gate MOSFET Scalable to 20 nm," IEEE Transactions on Electron Devices, vol. 47, No. 12, Dec. 2000, pp. 2320–2325.

Yang–Kyu Choi et al., "Sub–20nm CMOS FinFET Technologies," 2001 IEEE, IEDM, pp. 421–424.

Xuejue Huang et al., "Sub–50 nm P–Channel FinFET," IEEE Transactions on Electron Devices, vol. 48, No. 5, May 2001, pp. 880–886.

Xuejue Huang et al., "Sub 50–nm FinFET: PMOS," 1999 IEEE, IEDM, pp. 67–70.

Yang–Kyu Choi et al., "Nanoscale CMOS Spacer FinFET for the Terabit Era," IEEE Electron Device Letters, vol. 23, No. 1, Jan. 2002, pp. 25–27.

Copy of co–pending U.S. Application Ser. No. 10/830,006 filed Apr. 23, 2004 entitled: "Narrow Fin Finfet," 15 page specification, 13 sheets of drawings.

* cited by examiner

*Primary Examiner*—John F. Niebling
*Assistant Examiner*—Walter L. Lindsay, Jr.
(74) *Attorney, Agent, or Firm*—Harrity&Snyder, LLP

(57) ABSTRACT

A method of forming fins for a double-gate fin field effect transistor (FinFET) includes forming a second layer of semi-conducting material over a first layer of semi-conducting material and forming double caps in the second layer of semi-conducting material. The method further includes forming spacers adjacent sides of each of the double caps and forming double fins in the first layer of semi-conducting material beneath the double caps. The method also includes thinning the double fins to produce narrow double fins.

14 Claims, 7 Drawing Sheets

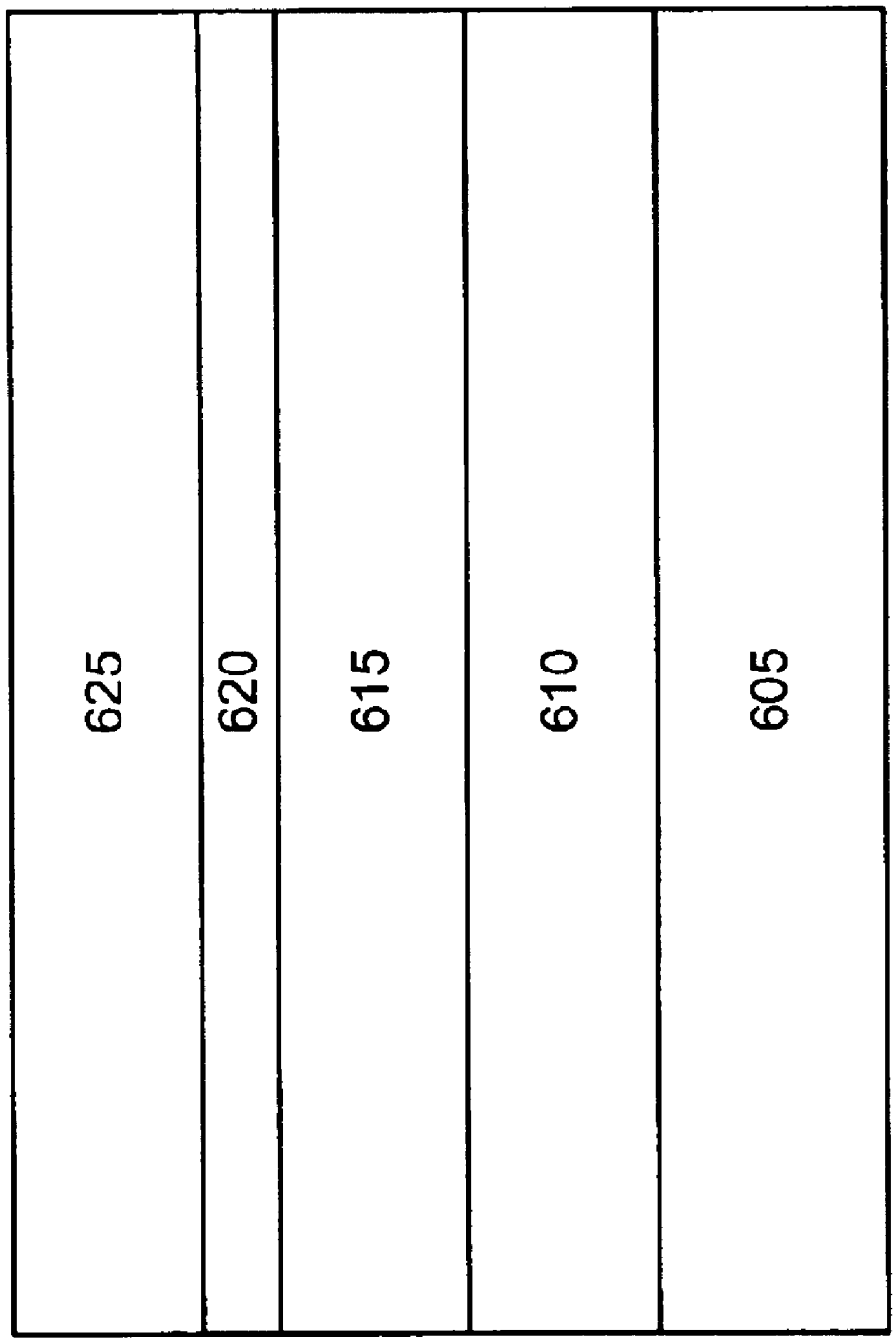

NARROW FINS BY OXIDATION IN DOUBLE-GATE FINFET

TECHNICAL FIELD

The present invention relates generally to transistors and, more particularly, to fin field effect transistors (FinFETs).

BACKGROUND ART

The escalating demands for high density and performance associated with ultra large scale integration semiconductor devices require design features, such as gate lengths, below 100 nanometers (nm), high reliability and increased manufacturing throughput. The reduction of design features below 100 nm challenges the limitations of conventional methodology.

For example, when the gate length of conventional planar metal oxide semiconductor field effect transistors (MOSFETs) is scaled below 100 nm, problems associated with short channel effects, such as excessive leakage between the source and drain, become increasingly difficult to overcome. In addition, mobility degradation and a number of process issues also make it difficult to scale conventional MOSFETs to include increasingly smaller device features. New device structures are, therefore, being explored to improve FET performance and allow further device scaling.

Double-gate MOSFETs represent structures that have been considered as candidates for succeeding existing planar MOSFETs. In double-gate MOSFETs, two gates may be used to control short channel effects. A FinFET is a recent double-gate structure that exhibits good short channel behavior. A FinFET includes a channel formed in a vertical fin. The FinFET structure may be fabricated using layout and process techniques similar to those used for conventional planar MOSFETs.

DISCLOSURE OF THE INVENTION

Implementations consistent with the present invention provide an exemplary process for forming double fins for a double-gate FinFET. The exemplary process, consistent with the invention, improves short-channel effects in the FinFET by thinning the double fins to create narrow fins using, for example, a thermal oxidation process. The exemplary double fin formation process may also, consistent with the invention, increase the device density, thus, reducing the pitch.

Additional advantages and other features of the invention will be set forth in part in the description which follows and, in part, will become apparent to those having ordinary skill in the art upon examination of the following, or may be learned from the practice of the invention. The advantages and features of the invention may be realized and obtained as particularly pointed out in the appended claims.

According to the present invention, the foregoing and other advantages are achieved in part by a method of forming fins for a double-gate fin field effect transistor (FinFET). The method includes forming a second layer of semi-conducting material over a first layer of semi-conducting material and forming double caps in the second layer of semi-conducting material. The method further includes forming spacers adjacent sides of each of the double caps and forming double fins in the first layer of semi-conducting material beneath the double caps. The method also includes thinning the double fins to produce narrow double fins.

According to another aspect of the invention, a method of forming fins for a double-gate fin field effect transistor (FinFET) is provided. The method includes depositing a silicon layer over a buried oxide layer and depositing a $Si_3N_4$ layer over the silicon layer. The method further includes etching the $Si_3N_4$ layer to form double caps, wherein each of the double caps comprises a rectangular cross-section with a width ranging from about 100 Å to about 1000 Å, and depositing and etching an oxide material to form spacers adjacent sides of each of the double caps, wherein the oxide material includes SiO or $SiO_2$. The method also includes etching the silicon layer to form fins beneath each of the double caps and thermally oxidizing the fins to thin the fins so as to produce narrow fins, wherein each of the narrow fins has a thickness ranging from about 50 Å to about 500 Å.

Other advantages and features of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference number designation may represent like elements throughout.

FIG. 6 illustrates the formation of a bottom gate layer, gate insulation layer and channel layer for a planar FinFET consistent with another embodiment of the invention;

BEST MODE FOR CARRYING OUT THE INVENTION

The following detailed description of the invention refers to the accompanying drawings. The same reference numbers in different drawings may identify the same or similar elements. Also, the following detailed description does not limit the invention. Instead, the scope of the invention is defined by the appended claims.

Consistent with the present invention, an exemplary process for forming double fins for a double-gate FinFET is provided. The exemplary process may employ thermal oxidation for thinning the double fins to create narrow fins, thereby improving device short-channel effects.

Figure 1:
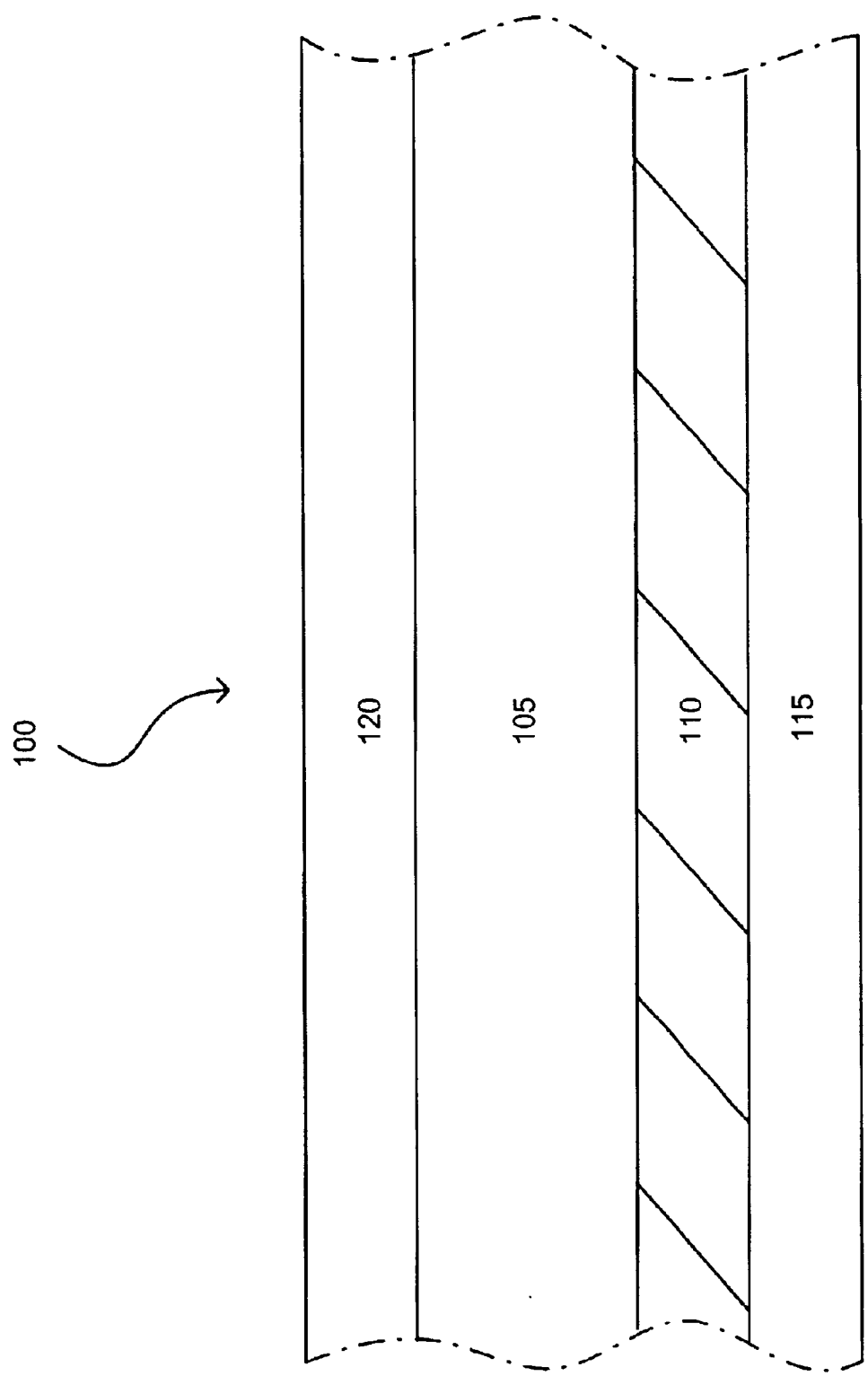
FIG. 1 illustrates exemplary layers of a silicon-on-insulator (SOI) wafer that may be used for forming a double-gate FinFET consistent with the present invention.

FIG. 1 illustrates a cross-section of a silicon on insulator (SOI) wafer 100 formed in accordance with an exemplary embodiment of the present invention. SOI wafer 100, consistent with the present invention, may include a buried oxide layer 110 formed on a substrate 115. A fin layer 105 may further be formed on buried oxide layer 110. The thickness of fin layer 105 may range, for example, from about 100 Å to about 1000 Å and the thickness of buried oxide layer 110 may range, for example, from about 1000 Å to about 3000 Å. Fin layer 105 and substrate 115 may include, for example, silicon, though other semiconducting materials, such as germanium, may be used. A layer 120 of material, such as, for example, $Si_3N_4$, may be formed on fin layer 105. Layer 120 may be deposited on fin layer 105 and may range, for example, from about 50 Å to about 500 Å in thickness.

Figure 2B:
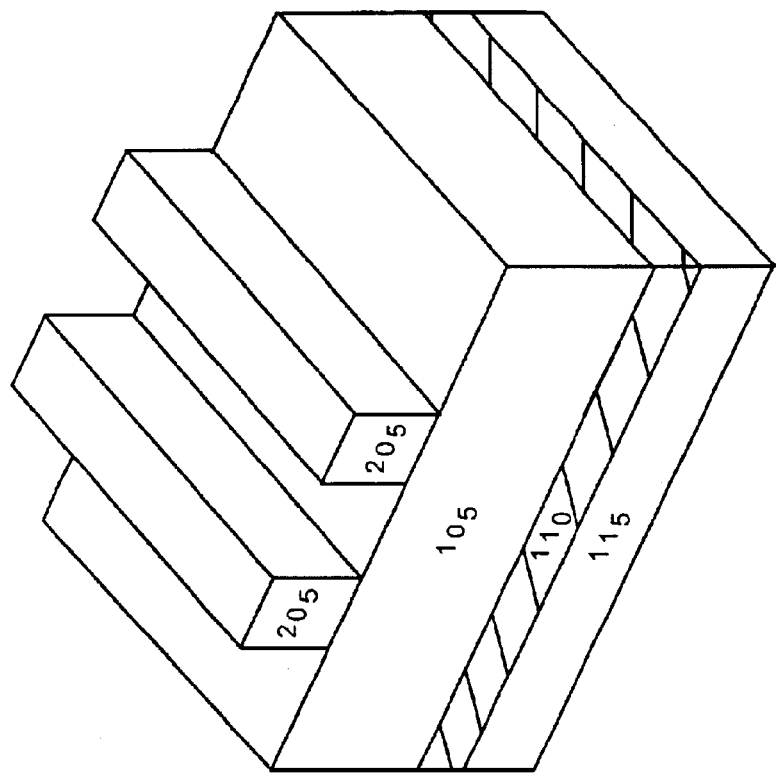
FIGS. 2A and 2B illustrate the formation of caps on the fin layer of FIG. 1 consistent with the invention.
Figure 2A:
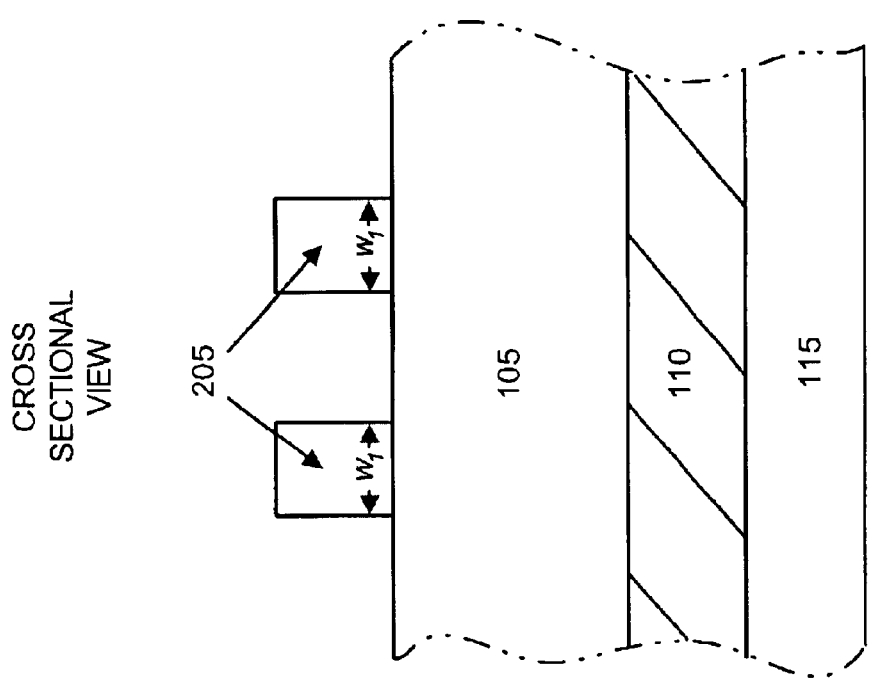
Figure 3:
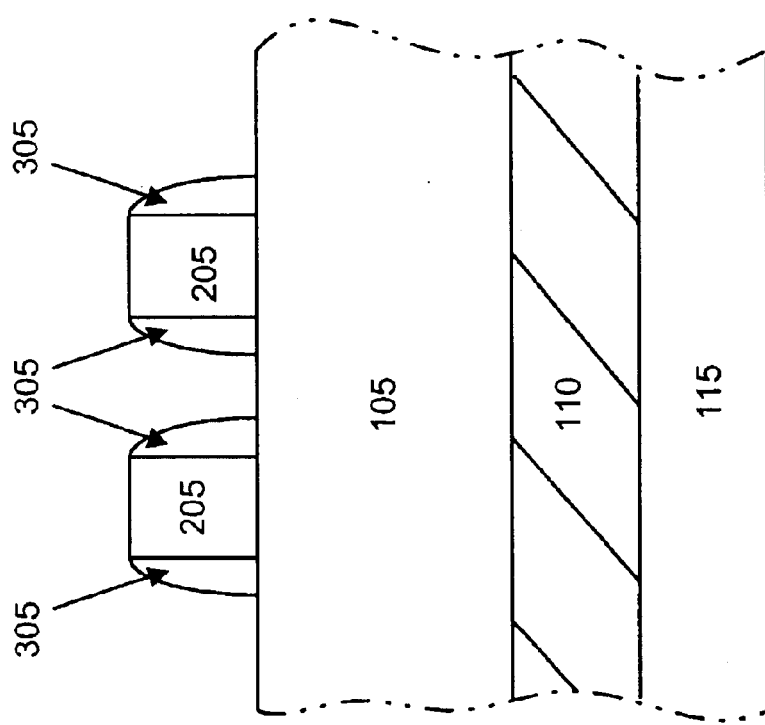
FIG. 3 illustrates the formation of spacers adjacent the caps of FIGS. 2A and 2B consistent with the invention.

As shown in FIGS. 2A and 2B, two caps 205 may be defined in layer 120. Caps 205 may be defined, for example, using conventional etching processes and may have a width $w_1$ that ranges from about 50 Å to about 500 Å. Spacers 305 may then be formed on the sides of caps 205, as shown in FIG. 3. Spacers 305 may be thermally grown, or deposited and etched, on the sides of caps 205 and may include, for example, an oxide material. The oxide material may include, for example, SiO or $SiO_2$, though other oxide materials may be used.

Figure 4:
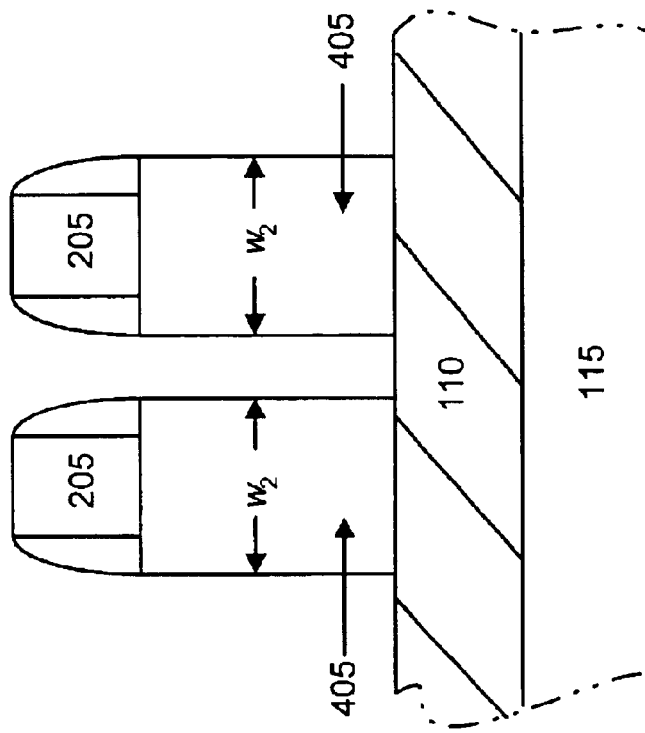
FIG. 4 illustrates the formation of double fins from the fin layer of FIG. 3 consistent with the invention.
Figure 5B:
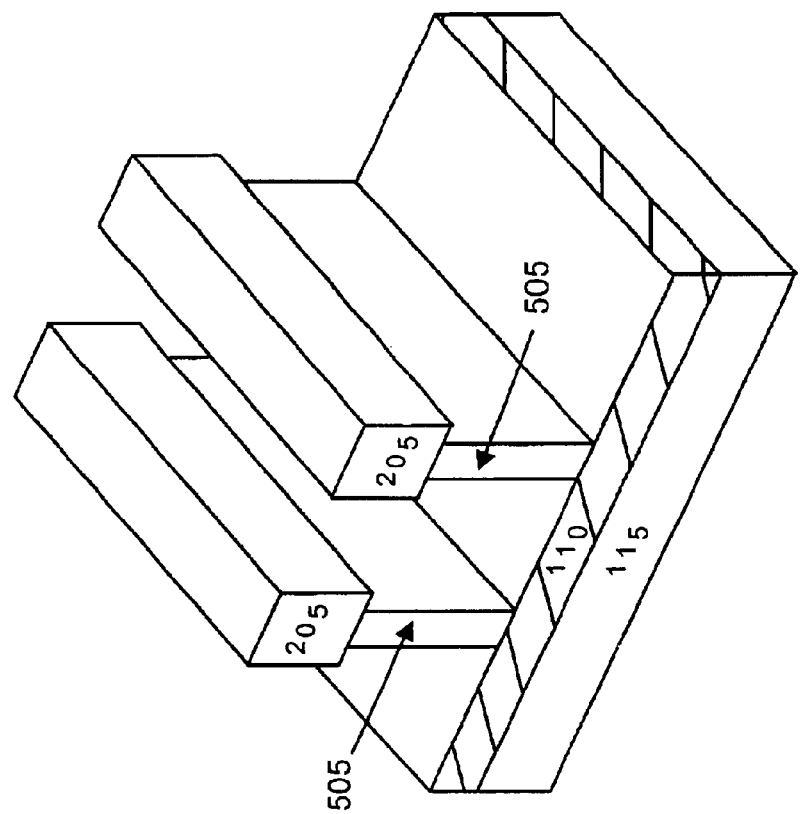
FIGS. 5A and 5B illustrate thinning of the double fins of FIG. 4 consistent with the invention.
Figure 5A:
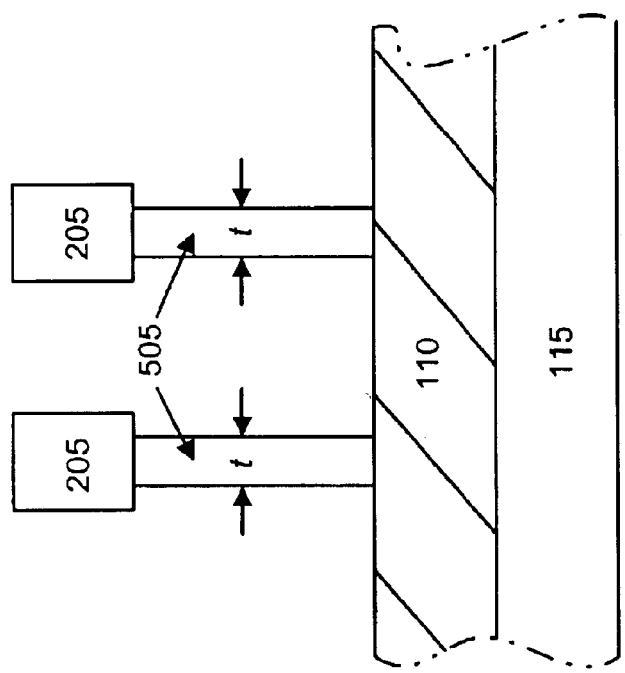

Two fins 405 may be formed from fin layer 105, as shown in FIG. 4. Fins 405 may be formed beneath spacers 305 and caps 205 using, for example, conventional etching processes. Fins 405 may include a width $w_2$ ranging from about 50 Å to about 500 Å. Thermnal oxidation may then be performed and the oxide removed to thin down fins 405 to create thinned fins 505, as shown in FIGS. 5A and 5B. The thickness t of thinned fins 505 may range from about 100 Å to about 1000 Å. Oxide spacers 305 may also be removed, as further shown in FIGS. 5A and 5B, during the oxide removal. The thinning of fins 505, thereby, improves the short-channel effects in a double-gate FinFET that can result from the above-described process (with the addition of double gates that are not shown). The exemplary process described above for forming thinned fins for a double-gate FinFET additionally may increase the device density, thus, reducing the device pitch.

EXEMPLARY METAL-INDUCED CRYSTALLIZATION FOR TOP-BOTTOM GATE DOUBLE GATE FINFET

Figure 7:
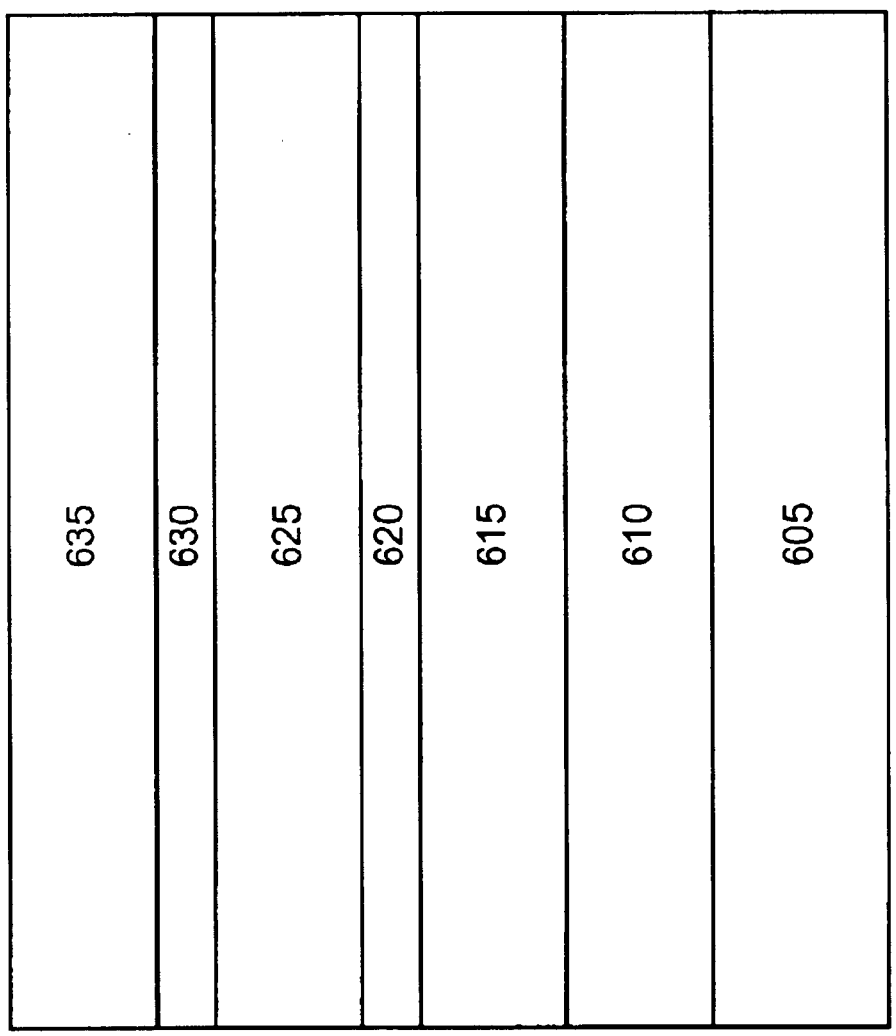
FIG. 7 illustrates the formation of another gate insulation layer and a top gate layer on the channel layer of FIG. 6 consistent with another embodiment of the invention.

FIGS. 6–7 illustrate an exemplary process for forming a planar double-gate FinFET with top/bottom gates using metal-induced crystallization. As shown in FIG. 6, a layer 610 of oxide, for example, may be grown on a bulk wafer that includes a substrate 605. Oxide layer 610 may include, for example, SiO or $SiO_2$, though other oxide materials may be used, and may range, for example, from about 100 Å to about 500 Å in thickness. A layer 615 of material for a bottom gate may then be deposited on oxide layer 610. Layer 615 may include polysilicon or a metal material, such as, for example, TiN, W, or Mo, and may range from about 100 Å to about 500 Å in thickness. A gate insulation layer 620 may then be deposited on layer 615. Gate insulation layer 620 may include SiO, $SiO_2$, SiN, SiON, $HFO_2$, $Zro_2$, $Al_2O_3$, HfSiO(x) ZnS, $MgF_2$, or other high-K dielectric materials. The thickness of gate insulation layer 620 may range, for example, from about 10 Å to about 50 Å. A channel layer 625 may then be deposited on gate insulation layer 620. Channel layer 625 may include an amorphous silicon (α-Si) material. Channel layer 625 may additionally include a layer of deposited nickel (Ni). After deposition of the nickel layer, the channel layer 625 may be annealed to convert the amorphous silicon and Ni to crystalline silicon via metal induced crystallization.

As shown in FIG. 7, a second gate insulation layer 630 may be deposited on channel layer 625. Gate insulation layer 630 may include SiO, $SiO_2$, SiN, SiON, $HFO_2$, $Zro_2$, $Al_2O_3$, HfSiO(x) ZnS, $MgF_2$, or other high-K dielectric materials. The thickness of gate insulation layer 630 may range, for example, from about 10 Å to about 50 Å. A layer 635 of material for a top gate may then be deposited on oxide layer gate insulation layer 630. Layer 635 may include polysilicon or a metal material, such as, for example, TiN, W, or Mo, and may range from about 100 Å to about 500 Å in thickness. The layers of material for the bottom gate and top gate may then be etched (not shown) using conventional etching processes to provide appropriate definition for the gates. Subsequent to gate definition, the resulting FinFET includes a planar double-gate device with top and bottom gates that has a channel in between the top and bottom gates created using metal-induced crystallization.

EXEMPLARY GATE DIELECTRIC STRESSER

Figure 8B:
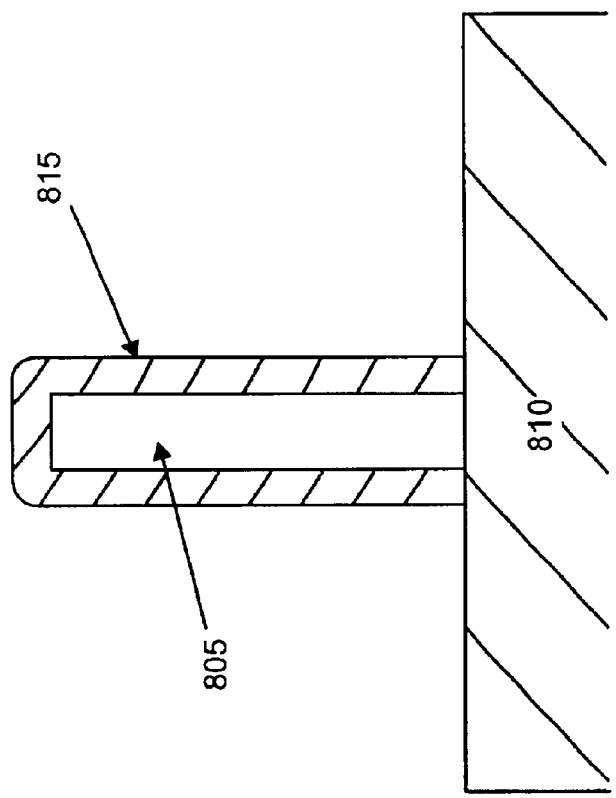
FIGS. 8A and 8B illustrate the formation of a selected dielectric layer on a FinFET fin to induce strain within the FinFET channel consistent with yet another embodiment of the invention.
Figure 8A:
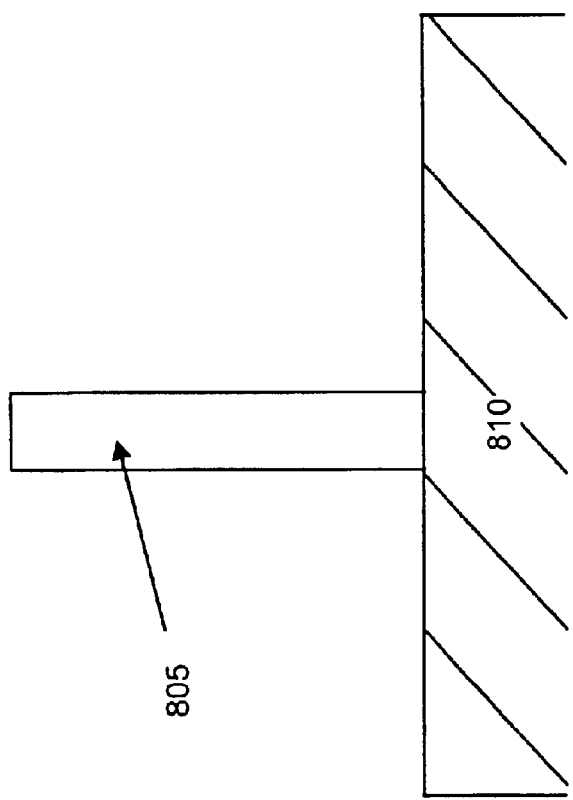

FIGS. 8A and 8B illustrate an exemplary FinFET gate dielectric, consistent with another embodiment of the invention, that improves FinFET carrier mobility. As shown, a fin 805 may be formed on a substrate 810, using any conventional technique, and a dielectric layer 815 may be thermally grown or deposited on the fin 805. The dielectric material of dielectric layer 815 may be chosen such that a desirable stress condition (i.e., due to tensile strain) may be created in fin 805, which represents the channel region of the FinFET. The dielectric material, such as a high dielectric constant dielectric material, may be appropriately selected to create tensile strain in the material that comprises fin 805. The induced tensile strain improves carrier mobility of the channel region, thus, improving FinFET performance.

In the previous descriptions, numerous specific details are set forth, such as specific materials, structures, chemicals, processes, etc., in order to provide a thorough understanding of the present invention. However, the present invention can be practiced without resorting to the details specifically set forth herein. In other instances, well known processing structures have not been described in detail, in order not to unnecessarily obscure the thrust of the present invention. In practicing the present invention, conventional photolithographic, etching and deposition techniques may be employed, and hence, the details of such techniques have not been set forth herein in detail.

Only the preferred embodiments of the invention and a few examples of its versatility are nd described in the present disclosure. It is to be understood that the invention is of use in various other combinations and environments and is capable of modifications he scope of the inventive concept as expressed herein.

What is claimed is:

1. A method of forming fins for a double-gate fin field effect transistor (FinFET), comprising:

forming a second layer of semi-conducting material over a first layer of semi-conducting material;

forming double caps in the second layer of semi-conducting material;

forming spacers adjacent sides of each of the double caps;

forming double fins in the first layer of semi-conducting material beneath the double caps; and thinning the double fins to produce narrow double fins.

2. The method of claim 1, wherein thinning the double fins comprises:

thermally oxidating the double fins.

3. The method of claim 1, wherein the second layer of semi-conducting material comprises $Si_3N_4$.

4. The method of claim 1, wherein the first layer of semi-conducting material comprises silicon.

5. The method of claim 1, wherein each of the double caps comprises a rectangular cross-section with a width ranging from about 50 Å to about 500 Å.

6. The method of claim 1, wherein forming the spacers comprises:

depositing and etching an oxide material.

7. The method of claim 6, wherein the oxide material comprises at least one of SiO and $SiO_2$.

8. The method of claim 6, further comprising:

removing the spacers subsequent to thinning the double fins.

9. The method of claim 1, wherein forming the double fins comprises:

etching the first layer of semi-conducting material such that each of the double fins comprises a rectangular cross-section with a width ranging from about 50 Å to about 500 Å.

10. The method of claim 1, wherein each of the narrow double fins comprises a thickness ranging from about 100 Å to about 1000 Å.

11. The method of claim 1, wherein forming the double caps comprises:

etching the second layer of semi-conducting material.

12. The method of claim 1, further comprising:

forming the first layer of semi-conducting material over a buried oxide layer.

13. The method of claim 12, wherein forming the first layer comprises:

depositing the first layer of semi-conducting material over the buried oxide layer.

14. A method of forming fins for a double-gate fin field effect transistor (FinFET), comprising:

depositing a silicon layer over a buried oxide layer;

depositing a $Si_3N_4$ layer over the silicon layer;

etching the $Si_3N_4$ layer to form double caps, wherein each of the double caps comprises a rectangular cross-section with a width ranging from about 50 Å to about 500 Å;

depositing and etching an oxide material to form spacers adjacent sides of each of the double caps, wherein the oxide material comprises at least one of SiO and $SiO_2$;

etching the silicon layer to form fins beneath each of the double caps; and thermally oxidating the fins to thin the fins so as to produce narrow fins, wherein each of the narrow fins comprises a thickness ranging from about 100 Å to about 1000 Å.

* * * * *